(12) United States Patent
Tanimoto

(10) Patent No.: US 9,787,253 B2
(45) Date of Patent: Oct. 10, 2017

(54) DOHERTY AMPLIFIER AND TRANSMISSION APPARATUS

(71) Applicant: NEC Corporation, Minato-ku, Tokyo (JP)

(72) Inventor: Takuya Tanimoto, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/911,512

(22) PCT Filed: Sep. 12, 2013

(86) PCT No.: PCT/JP2013/005411
§ 371 (c)(1),
(2) Date: Feb. 11, 2016

(87) PCT Pub. No.: WO2015/037034
PCT Pub. Date: Mar. 19, 2015

(65) Prior Publication Data
US 2016/0190997 A1 Jun. 30, 2016

(51) Int. Cl.
*H03F 3/68* (2006.01)
*H03F 1/02* (2006.01)
(Continued)

(52) U.S. Cl.
CPC ............. *H03F 1/0288* (2013.01); *H03F 1/07* (2013.01); *H03F 3/189* (2013.01); *H03F 3/19* (2013.01);
(Continued)

(58) Field of Classification Search
CPC ... H03F 3/60; H03F 3/602; H03F 3/68; H03F 3/191
(Continued)

(56) References Cited

U.S. PATENT DOCUMENTS 3,452,299 A * 6/1969 Angel ..................... G01S 7/034
327/422
8,193,857 B1 6/2012 Wilson
(Continued)

FOREIGN PATENT DOCUMENTS

CN 103178785 A 6/2013
DE 102012202870 A1 9/2012
(Continued)

OTHER PUBLICATIONS

International Search Report for PCT Application No. PCT/JP2013/005411, mailed on Oct. 22, 2013.
(Continued)

*Primary Examiner* — Steven J Mottola

(57) ABSTRACT

A Doherty amplifier (10) according to the present invention includes: a distribution unit (11) that distributes input signals; a main amplifier (12) that amplifies a first distributed signal output from the distribution unit (11); a transmission line unit (13) that transmits the first distributed signal amplified by the main amplifier (12); a peak amplifier (14) that amplifies a second distributed signal output from the distribution unit (11); a transmission line unit (15) that transmits the second distributed signal amplified by the peak amplifier (14); a synthesizing unit (16) that synthesizes the first distributed signal and the second distributed signal, and outputs a synthesized signal; and an impedance transformation unit (17) that performs an impedance transformation of the synthesized signal output from the synthesizing unit (16). The impedance transformation unit (17) includes a plurality of λ/4 transmission lines connected in series.

6 Claims, 9 Drawing Sheets

(51) Int. Cl.
  *H03F 3/189* (2006.01)
  *H03F 3/24* (2006.01)
  *H03F 3/19* (2006.01)
  *H03F 1/07* (2006.01)

(52) U.S. Cl.
  CPC ............... *H03F 3/24* (2013.01); *H03F 3/245* (2013.01); *H03F 2200/36* (2013.01); *H03F 2200/423* (2013.01); *H03F 2200/451* (2013.01)

(58) Field of Classification Search
  USPC .............................. 330/124 R, 286, 295, 302
  See application file for complete search history.

(56) References Cited

U.S. PATENT DOCUMENTS

| | | |
|---|---|---|
| 2002/0135425 A1 | 9/2002 | Kim et al. |
| 2006/0097783 A1 | 5/2006 | Okubo et al. |
| 2013/0093534 A1 | 4/2013 | Mei |
| 2014/0320214 A1* | 10/2014 | Liu ...................... H03F 1/0288 330/295 |
| 2016/0028352 A1 | 1/2016 | Mohamed et al. |

FOREIGN PATENT DOCUMENTS

| | | |
|---|---|---|
| EP | 1871004 A1 | 12/2007 |
| JP | H03-235402 A | 10/1991 |
| JP | 2001-036304 A | 2/2001 |
| JP | 2001-230640 A | 8/2001 |
| JP | 2005-204405 A | 7/2005 |
| JP | 2006-157900 A | 6/2006 |
| JP | 2006-345341 A | 12/2006 |
| JP | 2007-124460 A | 5/2007 |
| JP | 2010-502117 A | 1/2010 |
| WO | 01/03289 A1 | 1/2001 |

OTHER PUBLICATIONS

Japanese Office Action for JP Application No. 2015-536293 dated May 9, 2017 with English Translation.

Extended European Search Report for EP Application No. EP13893254.6 dated Mar. 20, 2017.

Jorge Moreno Rubio et al., "3-3.6-GHz Wideband GaN Doherty Power Amplifier Exploiting Output Compensation Stages", IEEE Transactions on Microwave Theory and Techniques, IEEE Service Center, vol. 60, No. 8, Aug. 1, 2012, pp. 2543-2548, XP011455075.

Zhou Xiang et al., "Design of Broadband Impedance Transformer Using Coupled Microstrip Transmission Lines", Microwave, Antenna, Propagation and EMC Technologies for Wireless Communications, 2009 3rd IEEE International Symposium on, IEEE, Oct. 27, 2009, pp. 994-997, XP031582020.

Extended European Search Report for EP Application No. EP13893254.6 dated May 23, 2017.

* cited by examiner

US 9,787,253 B2

DOHERTY AMPLIFIER AND TRANSMISSION APPARATUS

TECHNICAL FIELD

The present invention relates to a Doherty amplifier and a transmission apparatus, and more particularly, to a Doherty amplifier and a transmission apparatus which amplify signals in a plurality of frequency bands.

BACKGROUND ART

In a transmission apparatus, such as a base station, which transmits signals to mobile phone units, a Doherty amplifier is used as an amplifier to efficiently amplify the signals. When the Doherty amplifier receives a low-level signal, a main amplifier having characteristics, such as a class AB, operates, and when the Doherty amplifier receives a high-level signal, not only the main amplifier, but also a peak amplifier having characteristics, such as a class C, operates. Thus, highly-efficient signal amplification is achieved by controlling the amplifiers that operate depending on the level of the input signal.

A configuration example of a general Doherty amplifier will be described with reference to FIG. 10. The general Doherty amplifier distributes input signals and outputs the distributed signals to a main amplifier 110 and a peak amplifier 112. The signal input to the main amplifier 110 is amplified by the main amplifier 110, and is transmitted through an adjustment line 111. The signal input to the peak amplifier 112 is amplified by the peak amplifier 112, and is transmitted through an adjustment line 113. The signals transmitted through the adjustment line 111 and the adjustment line 113, respectively, are synthesized, and the synthesized signal is transmitted through an adjustment line 114. An adjustment line 115 is disposed at the preceding stage of the main amplifiers 110 and an adjustment line 116 is disposed at the preceding stage of the main amplifier 112 so as to match the phases of the signals in the synthesizing part.

The Doherty amplifier can amplify a signal having a predetermined frequency with high efficiency by adjusting the electrical length of each of the adjustment lines 111, 113, and 114. In this case, the electrical length is represented by a phase. The electrical length may be represented as, for example, 90 degrees. For example, an electrical length of 90 degrees indicates a 90-degree phase shift of a signal. The phase can also be represented by a wavelength λ. For example, a phase shift of λ/4 indicates a 90-degree phase shift.

For example, in the case of matching the output-side impedance of the adjustment line 114 to 50Ω and matching the input-side impedance of the adjustment line 114 to 25Ω, the adjustment line 114 having an electrical length of 90 degrees at 666 MHz and having a characteristic impedance of 35.5Ω is used. In this case, as shown in FIG. 11, assuming that a frequency band with a return loss characteristic of −30 dB or less is an effective band, the effective band is about 630 MHz to 700 MHz when the adjustment line 114 is used.

The electrical length of each of the adjustment line 111 and the adjustment line 113 is adjusted so that signals having a frequency ranging from 630 MHz to 700 MHz can be transmitted with high efficiency.

Thus, the Doherty amplifier which amplifies signals in a desired frequency band with high efficiency can be operated by controlling the electrical length of each of the adjustment lines 111, 113, and 114.

CITATION LIST

Patent Literature

[Patent Literature 1] Published Japanese Translation of PCT International Publication for Patent Application, No. 2010-502117

SUMMARY OF INVENTION

Technical Problem

However, when the Doherty amplifier shown in FIG. 10 is used, there is a problem that the Doherty amplifier can be applied only to predetermined so-called narrow-band signals. In general, the Doherty amplifier is used for a base station or the like to communicate with a mobile phone unit, and a predetermined frequency band is used for communication between the mobile phone unit and the base station. For this reason, the Doherty amplifier which is applied to so-called narrow-band signals is used for a base station. However, since it is expected that the Doherty amplifier will be applied to broadcasting equipment with various channels in the future, there is a demand for a Doherty amplifier that can be used in a wide frequency band.

For example, Patent Literature 1 discloses the configuration of an impedance matching circuit including a high-pass filter and a low-pass filter. However, Patent Literature 1 fails to suggest how to use an impedance control circuit disclosed in Patent Literature 1 in a Doherty amplifier that is used for a narrow-band communication. Patent Literature 1 merely discloses the configuration of the impedance matching circuit that operates in a wide frequency band.

An object of the present invention is to provide a Doherty amplifier that can be used in a wide frequency band, as a solution to the above-mentioned problem.

Solution to Problem

A Doherty amplifier according to a first exemplary aspect of the present invention includes: a distribution unit that distributes input signals; a main amplifier that amplifies a first distributed signal output from the distribution unit; a first transmission line unit that transmits the first distributed signal amplified by the main amplifier; a peak amplifier that amplifies a second distributed signal output from the distribution unit; a second transmission line unit that transmits the second distributed signal amplified by the peak amplifier; a synthesizing unit that synthesizes the first distributed signal output from the first transmission line unit and the second distributed signal output from the second transmission line unit, and outputs a synthesized signal; and an impedance transformation unit that performs an impedance transformation of the synthesized signal output from the synthesizing unit. The impedance transformation unit includes a plurality of λ/4 transmission lines connected in series.

A transmission apparatus according to a second exemplary aspect of the present invention includes: a signal generation unit that generates input signals at any frequency; a distribution unit that distributes the input signals; a main amplifier that amplifies a first distributed signal output from the distribution unit; a first transmission line unit that transmits the first distributed signal amplified by the main amplifier; a peak amplifier that amplifies a second distributed signal output from the distribution unit; a second transmission line unit that transmits the second distributed signal amplified by the peak amplifier, the second transmission line unit having substantially the same impedance as that of the first transmission line unit; a synthesizing unit that synthesizes the first distributed signal output from the first transmission line unit and the second distributed signal output from the second transmission line unit, and outputs a synthesized signal; an impedance transformation unit that performs an impedance transformation of the synthesized signal output from the synthesizing unit; and a signal transmission unit that transmits a signal output from the impedance transformation unit to an opposite apparatus. When an adjustment of a transmission line length of each of the first and second transmission line units is required along with a change in frequency of the input signals, a frequency band of the impedance transformation unit is broadened to such an extent that there is no need for adjustment of a transmission line length.

Advantageous Effects of Invention

According to the present invention, it is possible to provide a Doherty amplifier that can be used in a wide frequency band and can be easily tuned to any channel.

DESCRIPTION OF EMBODIMENTS

First Exemplary Embodiment

Figure 1:
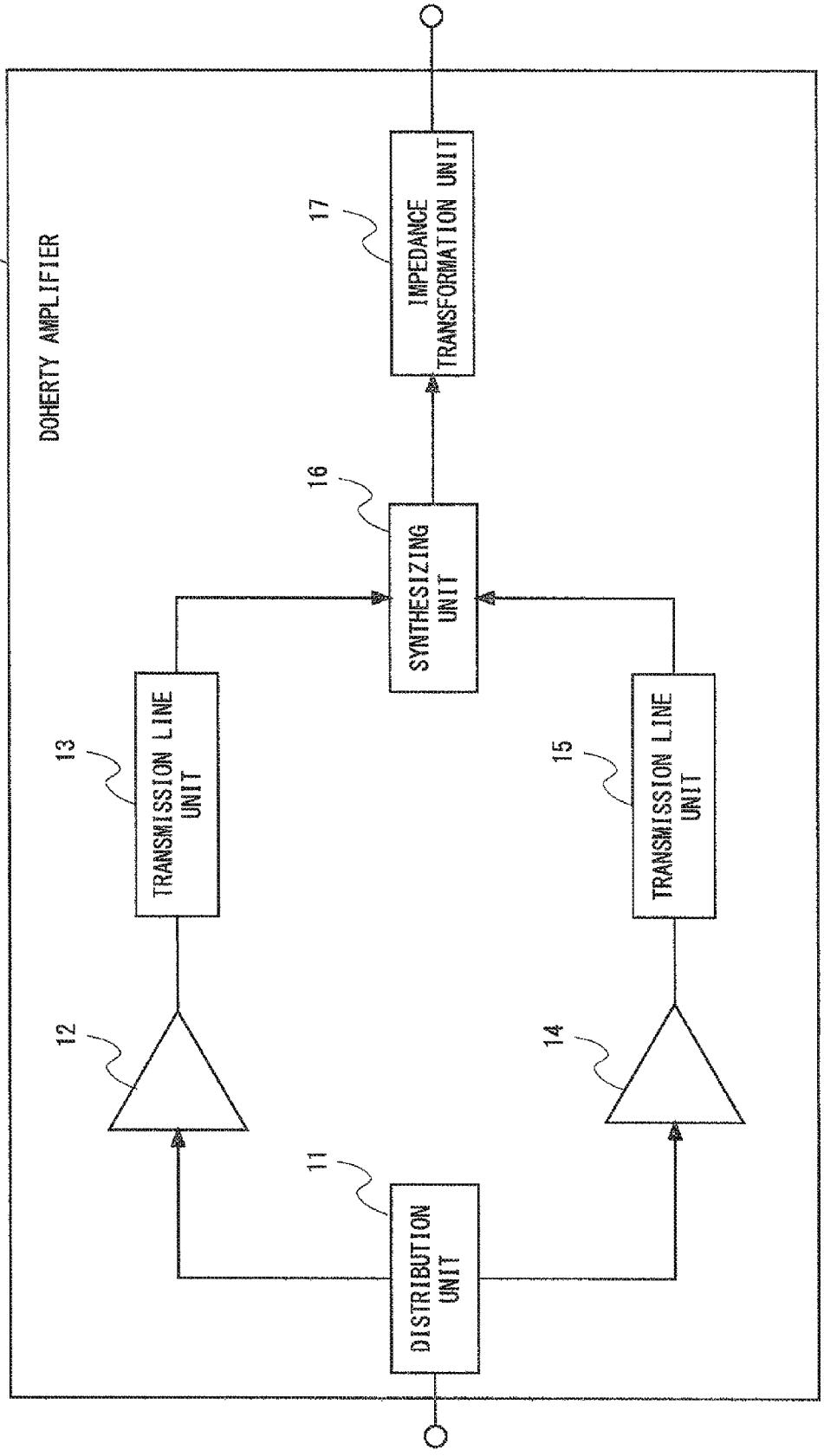
FIG. 1 is a block diagram showing a Doherty amplifier according to a first exemplary embodiment.

Exemplary embodiments of the present invention will be described below with reference to the drawings. First, a configuration example of a Doherty amplifier according to a first exemplary embodiment of the present invention will be described with reference to FIG. 1. A Doherty amplifier 10 shown in FIG. 1 includes a distribution unit 11, a main amplifier 12, a transmission line unit 13, a peak amplifier 14, a transmission line unit 15, a synthesizing unit 16, and an impedance transformation unit 17.

The distribution unit 11 distributes signals input to the Doherty amplifier 10, and outputs the distributed signals to the main amplifier 12 and the peak amplifier 14, respectively. The signals input to the Doherty amplifier 10 may be, for example, so-called high-frequency signals with frequencies ranging from several hundred MHz to several GHz.

Next, the main amplifier 12 amplifies the distributed signal output from the distribution unit 11. For example, a class-A, class-B, or class-AB amplifier may be used as the main amplifier 12. The main amplifier 12 transmits the amplified distributed signal through the transmission line unit 13.

The transmission line unit 13 is used to transmit the signal output from the main amplifier 12. The transmission line unit 13 shifts the phase of the signal without changing the characteristic impedance of 50Ω. For example, a copper plate may be used for the transmission line unit 13. The use of a copper plate for the transmission line unit 13 prevents an increase in transmission loss, in comparison to a case where the transmission line unit 13 is formed with a PWB (Printed Wiring Board) pattern. The signal frequency at which the main amplifier 12 can operate with high efficiency is determined based on the transmission line length of the transmission line unit 13. A transmission line length may also be referred to as, for example, an electrical length. For example, when a signal having a frequency other than the signal frequency at which the main amplifier 12 can operate with high efficiency in the transmission line unit 13 is input to the Doherty amplifier 10, the transmission line unit 13 is preliminarily adjusted to the transmission line unit 13 having an appropriate electrical length depending on the frequency of the input signal. Alternatively, the transmission line unit 13 is preliminarily replaced by a transmission line unit having an appropriate electrical length depending on the frequency of the input signal.

Next, the peak amplifier 14 amplifies the distributed signal output from the distribution unit 11. For example, a class-C amplifier with high efficiency characteristics may be used as the peak amplifier 14. The peak amplifier 14 transmits the amplified distributed signal through the transmission line unit 15.

The transmission line unit 15 is used to transmit the signal output from the peak amplifier 14. The transmission line unit 15 shifts the phase of the signal without changing the characteristic impedance of 50Ω. As with the transmission line unit 13, a copper plate, for example, may be used for the transmission line unit 15. The signal frequency at which the peak amplifier 14 is turned off when the input power is small and the transmission line unit 15 is open (has no influence) as viewed from the main amplifier 12 when only the main amplifier 12 operates is determined based on the electrical length of the transmission line unit 15. For example, when a signal having a frequency other than the signal frequency at which the transmission line unit 15 is open as viewed from the main amplifier 12 when the peak amplifier 14 is turned off is input to the Doherty amplifier 10, the transmission line unit 15 is preliminarily adjusted to the transmission line unit 15 having an appropriate electrical length depending on the frequency of the input signal. Alternatively, the transmission line unit 15 is preliminarily preplaced by the transmission line unit 15 having an appropriate electrical length depending on the frequency of the input signal.

The amplified signal which is amplified by the main amplifier 12 and transmitted through the transmission line unit 13 and the amplified signal which is amplified by the peak amplifier 14 and transmitted through the transmission line unit 15 are input to the synthesizing unit 16. The synthesizing unit 16 synthesizes the amplified signals which are received from the amplifiers through the transmission line units 13 and 15, respectively. The synthesizing unit 16 outputs the synthesized signal to the impedance transformation unit 17.

The impedance transformation unit 17 transforms the characteristic impedance of the synthesizing unit 16 into the characteristic impedance of the output of the Doherty amplifier 10. For example, the impedance transformation unit 17 performs an impedance transformation in the range from the characteristic impedance 25Ω of the synthesizing unit 16 to the characteristic impedance 50Ω of the output part of the Doherty amplifier 10.

In the impedance transformation unit 17, the signal frequency at which the impedance transformation can be performed, or the frequency of signals that can be transmitted is determined in advance as in the transmission line unit 13 and the transmission line unit 15. However, the frequency band of signals that can be processed by the impedance transformation unit 17 is sufficiently wide in comparison to the transmission line unit 13 and the transmission line unit 15. Specifically, when an adjustment of the electrical length of each of the transmission line unit 13 and the transmission line unit 15 is required along with a change in frequency of signals input to the Doherty amplifier 10, the frequency band of the impedance transformation unit 17 is broadened to such an extent that there is no need for adjustment of the electrical length of the impedance transformation unit 17.

As described above, broadening of the frequency band of the impedance transformation unit 17 in the Doherty amplifier 10 and adjustment of only the transmission line unit 13 and the transmission line unit 15 make it possible to broaden the frequency band in which the Doherty amplifier 10 can be used with high efficiency.

Figure 10:
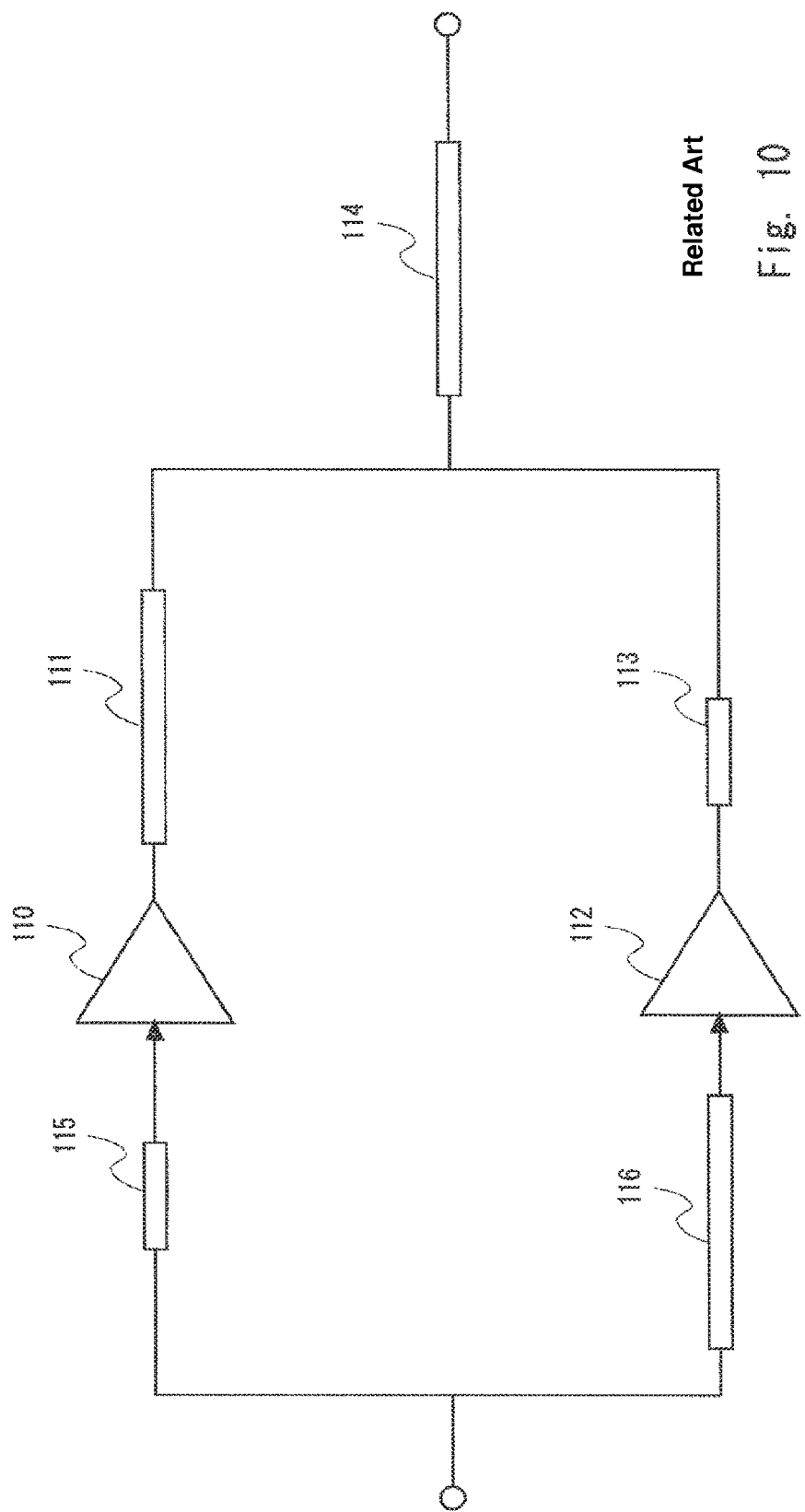
FIG. 10 is a block diagram showing a general Doherty amplifier.

Furthermore, broadening of the frequency band of the impedance transformation unit 17 makes it possible to reduce the number of locations at which the transmission line length, i.e., the electrical length, is adjusted. For example, when signals having different frequencies are input to a Doherty amplifier shown in FIG. 10, it is necessary to adjust the electrical length of each of the adjustment lines 111, 113, and 114. On the other hand, in the Doherty amplifier 10 shown in FIG. 1, the frequency band of the impedance transformation unit 17 is broadened, which enables the impedance transformation unit 17 to transmit signals of various frequencies. Accordingly, even when signals having different frequencies are input to the Doherty amplifier 10, it is only necessary to adjust the electrical length of the transmission line units 13 and 15. In other words, in comparison with the Doherty amplifier shown in FIG. 10, the Doherty amplifier 10 shown in FIG. 1 has an advantageous effect that the number of elements that require an adjustment can be reduced by one when signals having different frequencies are input.

Second Exemplary Embodiment

Figure 2:
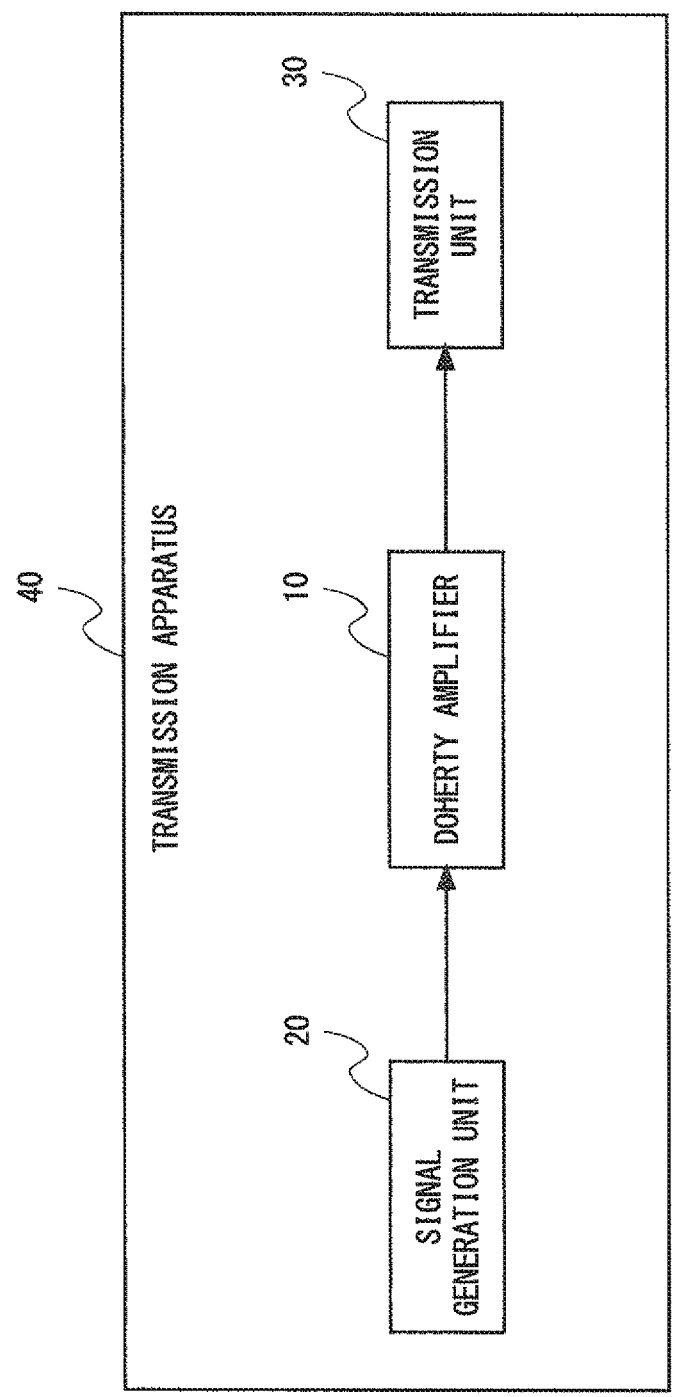
FIG. 2 is a block diagram showing a transmission apparatus according to a second exemplary embodiment.

Next, a configuration example of a transmission apparatus 40 according to a second exemplary embodiment of the present invention will be described with reference to FIG. 2. The transmission apparatus 40 may be, for example, a broadcasting communication apparatus compatible with multiple-channel communication, or a base station apparatus. The transmission apparatus 40 is not limited to a broadcasting communication apparatus, a base station apparatus, or the like, and may be a communication apparatus with a wide usable frequency band.

The transmission apparatus 40 includes a signal generation unit 20, the Doherty amplifier 10, and a transmission unit 30. The Doherty amplifier 10 is similar to the Doherty amplifier 10 described above with reference to FIG. 1. Accordingly, a detailed description of the Doherty amplifier 10 is omitted.

The signal generation unit 20 generates a radio frequency (RF) signal. The signal generation unit 20 outputs the generated RF signal to the Doherty amplifier 10. In this case, the signal generation unit 20 may generate the RF signal at any frequency. For example, the signal generation unit 20 may change the frequency band of the generated RF signal when a channel of a different usable frequency band is set.

The frequency band that can be generated by the signal generation unit 20 may be determined depending on the frequency band of the signal that can be amplified by the Doherty amplifier 10. For example, when the usable frequency band is changed upon replacement of the transmission line unit in the Doherty amplifier 10, the signal generation unit 20 may also generate the RF signal in the changed frequency band.

The signal generation unit 20 may generate RF signals in a plurality of frequency bands. If the transmission apparatus 40 includes a plurality of signal generation units 20, the signal generation unit 20 to be used may be switched in accordance with a change in the frequency band of the RF signal.

The Doherty amplifier 10 amplifies the RF signal output from the signal generation unit 20. The Doherty amplifier 10 outputs the amplified RF signal to the transmission unit 30. The transmission unit 30 transmits the RF signal output from the Doherty amplifier 10 to another communication apparatus which is different from the transmission apparatus 40.

As described above, the Doherty amplifier 10 is disposed in, for example, the transmission apparatus 40, and is used to amplify the RF signal to be processed by the transmission apparatus 40. At this time, the adjustment or replacement of the transmission line units in the Doherty amplifier 10 enables the transmission apparatus 40 to transmit RF signals in various frequency bands.

Figure 3:
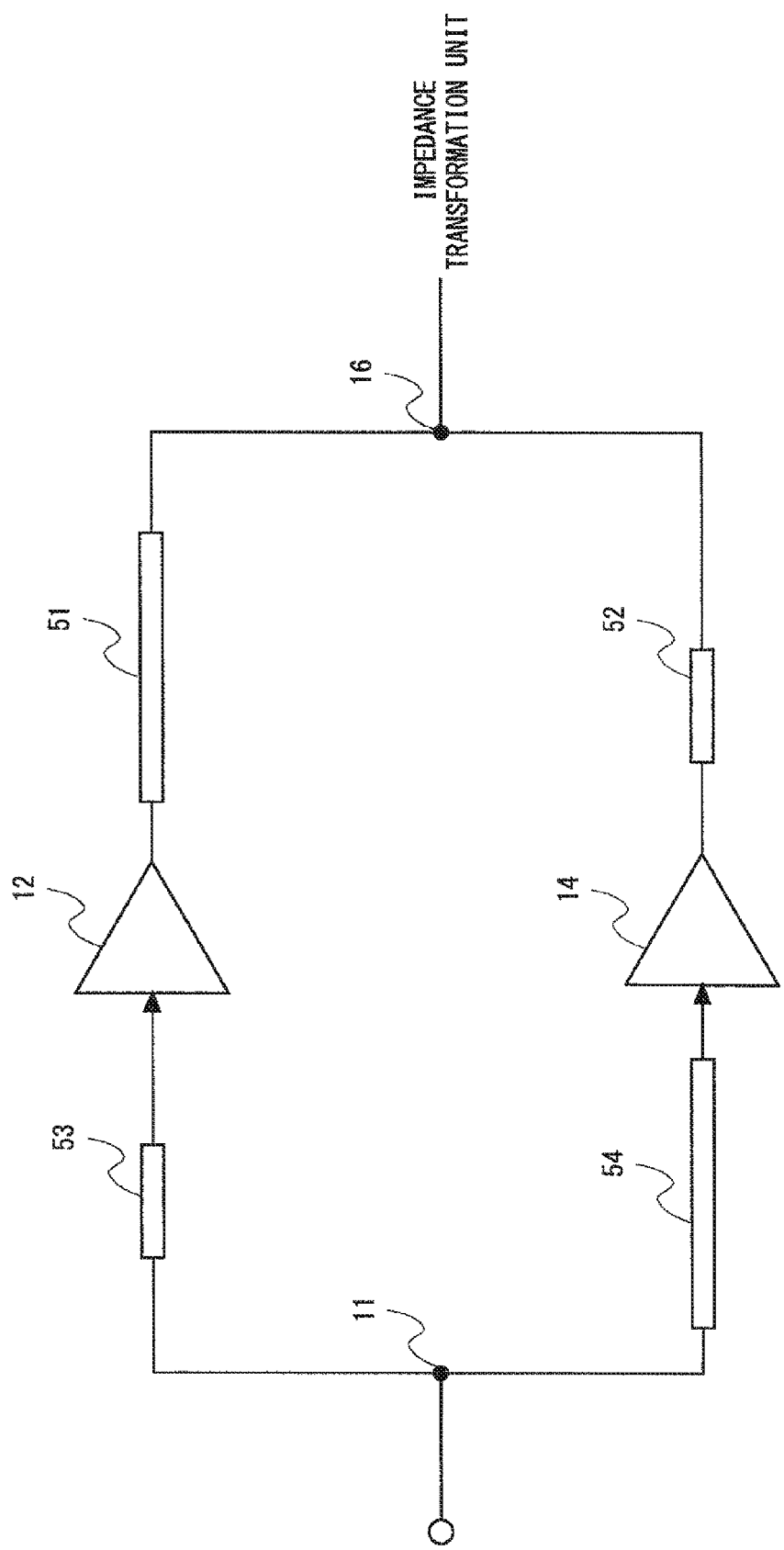
FIG. 3 is a block diagram showing a Doherty amplifier according to the second exemplary embodiment.

Next, a configuration example of the Doherty amplifier 10 according to the second exemplary embodiment of the present invention will be described with reference to FIG. 3. Referring to FIG. 3, an example of the configuration between the distribution unit 11 and the synthesizing unit 16 will be mainly described.

The Doherty amplifier 10 includes the distribution unit 11, the main amplifier 12, an adjustment line 51, the peak amplifier 14, an adjustment line 52, an adjustment line 53, an adjustment line 54, and the synthesizing unit 16. The distribution unit 11 is a node at which an input terminal, the main amplifier 12, and the peak amplifier 14 are connected to each other. Since the main amplifier 12 and the peak amplifier 14 are similar to those shown in FIG. 1, detailed descriptions thereof are omitted. The synthesizing unit 16 is a node at which the adjustment line 51, the adjustment line 52, and the impedance transformation unit 17 are connected to each other.

The adjustment line 51 and the adjustment line 52 respectively correspond to the transmission line unit 13 and the transmission line unit 15 shown in FIG. 1. For example, a copper plate is used for the adjustment line 51 and the adjustment line 52, and the length of the copper plate is adjusted depending on the frequency band of the signal to be transmitted. The characteristic impedances of the lines of the adjustment line 51 and the adjustment line 52 are changed by adjusting the width of the copper plate. For example, a copper plate having a characteristic impedance of 50Ω is used for the adjustment line 51 and the adjustment line 52. In this case, the length of each of the adjustment lines 51 and 52 refers to the length in the same direction as the direction in which signals are transmitted, and the width of each of the adjustment lines 51 and 52 refers to the length in the direction orthogonal to the direction in which signals are transmitted.

A copper plate having an electrical length that is 90 degrees greater than the electrical length of the adjustment line 52 may be used for the adjustment line 51. In other words, the electrical length of the adjustment line 51 is set to be 90 degrees greater than the electrical length of the adjustment line 52, and the phase of the signal to be transmitted is delayed by 90 degrees. The electrical length of the adjustment line 51 is set to be 90 degrees greater than the electrical length of the adjustment line 52 for the following reason.

The peak amplifier 14 is turned on or off depending on the level of the input signal. For example, when the level of the input signal is lower than a predetermined level, the peak amplifier 14 stops operating and is turned off. Thus, when the peak amplifier 14 is turned off, it is necessary to prevent the signals output from the main amplifier 12 through the adjustment line 51 from entering the adjustment line 52 and the peak amplifier 14. In other words, when the peak amplifier 14 is turned off, all signals output from the main amplifier 12 need to be transmitted to the impedance transformation unit 17. At this time, if the electrical length of the adjustment line 52 is 90 degrees less than the electrical length of the adjustment line 51, it is possible to prevent the signals output from the main amplifier 12 from entering the adjustment line 52 and the peak amplifier 14. For this reason, the adjustment line 51 is formed with an electrical length that is 90 degrees greater than the electrical length of the adjustment line 52.

The signals transmitted through the adjustment line 51 and the adjustment line 52, respectively, are synthesized by the synthesizing unit 16, and are output to the impedance transformation unit 17. The adjustment line 53 is disposed between the distribution unit 11 and the main amplifier 12 and the adjustment line 54 is disposed between the distribution unit 11 and the peak amplifier 14 so as to match the phases of the signals in the synthesizing unit 16.

Next, a configuration example of the impedance transformation unit 17 according to the second exemplary embodiment of the present invention will be described with reference to FIG. 4. The impedance transformation unit 17 includes impedance transformers 61 to 63. The impedance transformers 61 to 63 are connected in series between the synthesizing unit 16 and an output terminal.

The impedance transformers 61 to 63 are transmission lines each having an electrical length of λ/4 (90 degrees). The characteristic impedances of the impedance transformers 61 to 63 are determined based on the width of the length in the direction orthogonal to the direction of the length of the electrical length.

Figure 4:
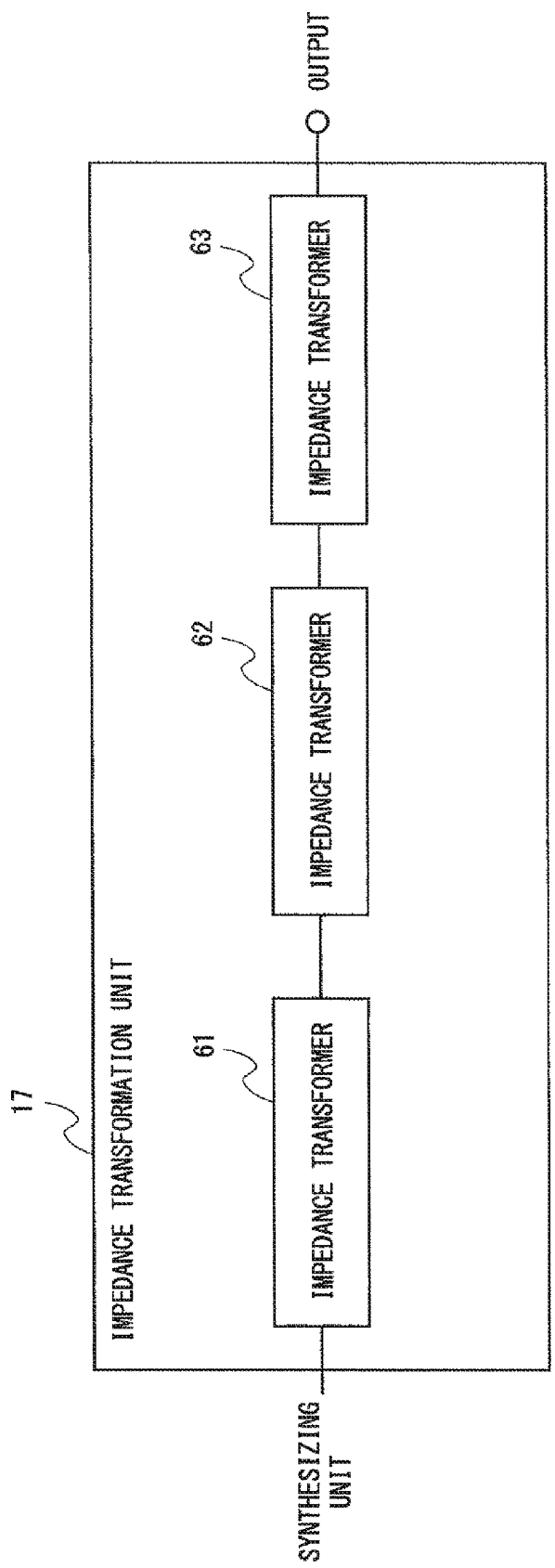
FIG. 4 is a block diagram showing an impedance transformation unit according to the second exemplary embodiment.
Figure 5:
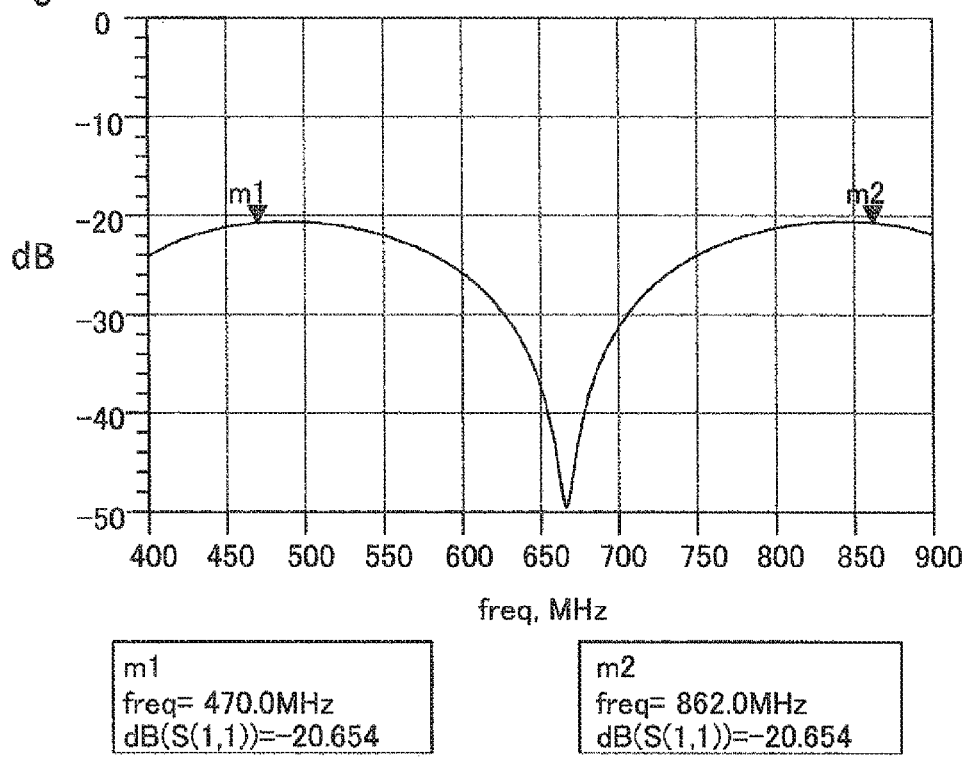
FIG. 5 is a graph for explaining a usable frequency band when the impedance transformation unit according to the second exemplary embodiment is used.

Referring now to FIG. 5, a change in the usable frequency band when the impedance transformation unit 17 shown in FIG. 4 is used will be described. The characteristic impedances of the impedance transformers 61 to 63, for example, when the impedance at the output terminal of the Doherty amplifier 10 is 50Ω and the impedance of the synthesizing unit 16 is 25Ω, will be described. The characteristic impedance at the output terminal is set to 50Ω which is generally used as the characteristic impedance of a signal to be output to another circuit. Since the lines each having a characteristic impedance of 50Ω are connected in parallel, the impedance at a branch point is 25Ω.

In this case, the characteristic impedance of the impedance transformer 62, which is disposed in the center of the impedance transformers 61 to 63 connected in series, is calculated as a square root of 50 (Ω)×25 (Ω). In this case, the characteristic impedance of the impedance transformer 62 is set to 35.4Ω. The characteristic impedance of the impedance transformer 61 is calculated as a square root of 25×35.4. In this case, the characteristic impedance of the impedance transformer 61 is set to 29.7Ω. The characteristic impedance of the impedance transformer 63 is calculated as a square root of 50×35.4. In this case, the characteristic impedance of the impedance transformer 63 is set to 42Ω.

In this manner, the characteristic impedances of the impedance transformers 61 to 63 are set to values that gradually increase from the impedance transformer 61 to the impedance transformer 63.

Figure 11:
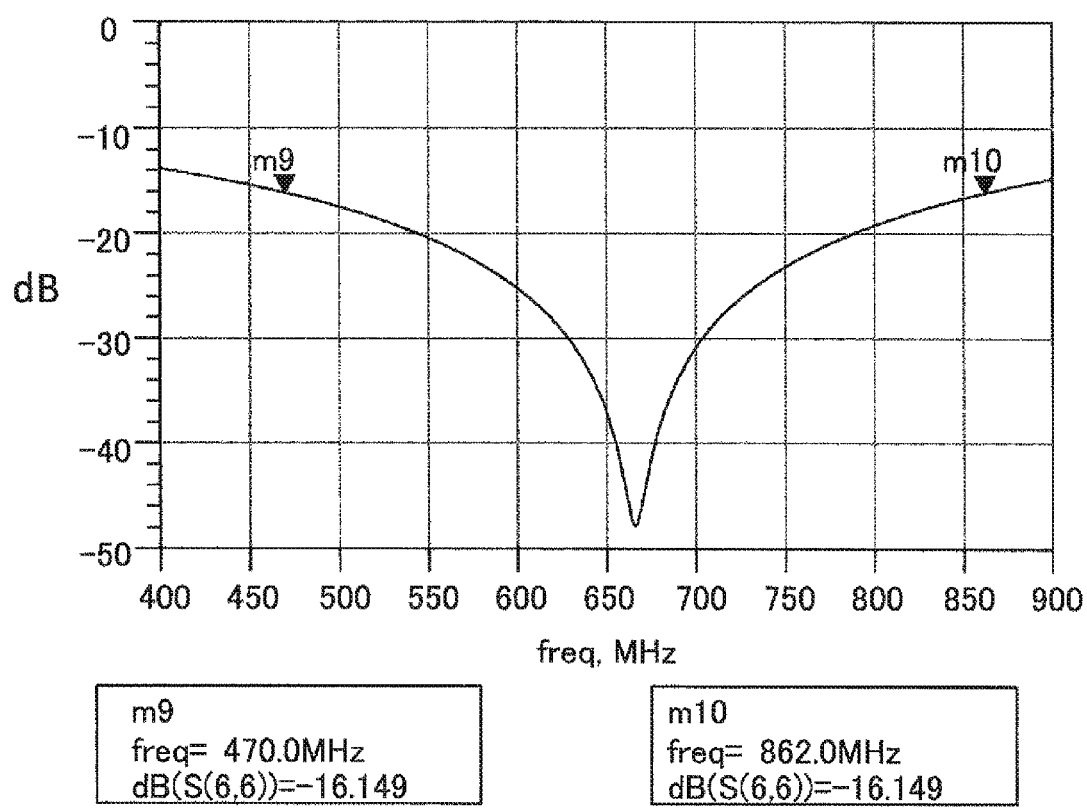
FIG. 11 is a graph for explaining a usable frequency band when the general Doherty amplifier is used.

FIG. 5 shows a relationship between a frequency and a return loss characteristic when the characteristic impedances calculated as described above are set to the impedance transformers 61 to 63, respectively. FIG. 5 shows that the entire return loss characteristic has improved in comparison to FIG. 11 which shows a relationship between a frequency and a return loss characteristic when one impedance transformer having a characteristic impedance of 35.5Ω is used. However, assuming that a region with a return loss characteristic of −30 dB or less is an effective band, the effective band is about 630 MHz to 700 MHz, so that there is little difference between FIG. 5 and FIG. 11.

Figure 6:
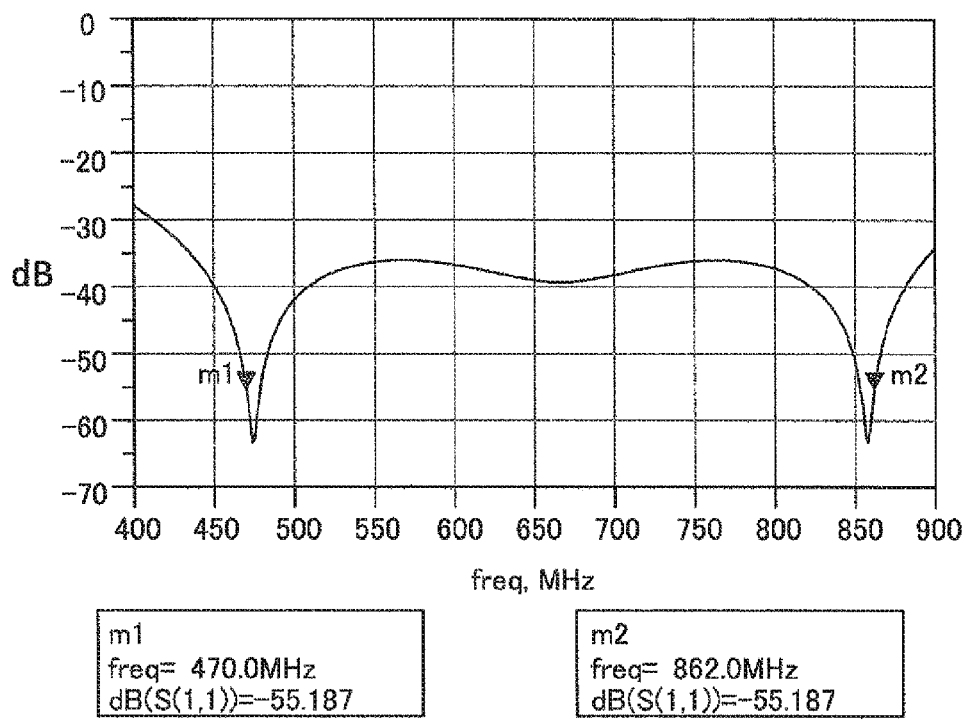
FIG. 6 is a graph for explaining a usable frequency band when the impedance transformation unit according to the second exemplary embodiment is used.

Referring now to FIG. 6, a change in the usable frequency band when the characteristic impedances of the impedance transformers 61 to 63 are further adjusted will be described. FIG. 6 shows a relationship between a frequency and a return loss characteristic when the characteristic impedance of the impedance transformer 61 is set to 28.2Ω; the characteristic impedance of the impedance transformer 62 is set to 35.9Ω; and the characteristic impedance of the impedance transformer 63 is set to 45.5Ω. The characteristic impedance of each impedance transformer may be adjusted by using, for example, a simulation device.

As shown in FIG. 6, assuming that a region with a return loss characteristic of −30 dB or less indicates an effective band, the effective band is about 420 MHz to 900 MHz. Accordingly, in comparison with FIGS. 5 and 11, the effective band of the impedance transformation unit 17 is expanded and broadened.

Thus, there is no need to adjust the electrical length or the like of the impedance transformers 61 to 63 constituting the impedance transformation unit 17, even if the electrical length of each of the adjustment line 51 and the adjustment line 52 is adjusted to an appropriate length, or the adjustment line 51 and the adjustment line 52 are replaced by an adjustment line having an appropriate electrical length, when the frequency of the signal input to the Doherty amplifier 10 is changed in, for example, the range from 420 MHz to 900 MHz along with the broadening of the frequency band of the impedance transformation unit 17.

That is, when the frequency band of the input signal is changed, the adjustment or replacement of only the adjustment line 51 and the adjustment line 52 of the Doherty amplifier 10 enables the Doherty amplifier 10 to amplify, with high efficiency, the signal whose frequency is changed.

While the configuration in which three impedance transformers are connected in series is illustrated above as the impedance transformation unit 17 shown in FIG. 4, the number of impedance transformers to be connected may be changed in accordance with the increased width of the effective frequency band. Three impedance transformers connected in series can cover the frequency band that is used for digital terrestrial broadcasting and the like in the UHF band.

According to the configuration in which the frequency band of the impedance transformation unit 17 is broadened and there is no need to change the electrical length or the like when the frequency band of the impedance transformation unit 17 is within a predetermined frequency band, the following advantageous effects can be obtained. For example, when the Doherty amplifier 10 is disposed in the transmission apparatus 40, the impedance transformation unit 17 may be disposed at a location within the apparatus that cannot be easily accessed during maintenance work or the like, and the adjustment line 51 and the adjustment line 52, which require an adjustment, replacement work, or the like, may be disposed at locations near the surface of the apparatus that can be easily accessed during maintenance work. In other words, the impedance transformation unit 17 may be disposed at a location within the apparatus where the impedance transformation unit 17 cannot be substantially manipulated, and the adjustment line 51 and the adjustment line 52 may be disposed at locations where the adjustment lines 51 and 52 can be easily manipulated, for example, when a cover on the surface of the apparatus is removed.

This configuration increases the degree of freedom regarding the location where the impedance transformation unit 17 can be disposed, and facilitates the design of the apparatus including the Doherty amplifier 10.

Third Exemplary Embodiment

Next, a configuration example of the impedance transformation unit 17 when a distributed constant circuit is used for the impedance transformation unit 17 will be described with reference to FIG. 7. The impedance transformation unit 17 includes distributed constant circuit elements 71 to 76. This example shows that the distributed constant circuit elements 71 to 75 are connected in series, for convenience of explanation. However, the circuit elements may be, for example, transmission lines having different electrical lengths and widths, and the distributed constant circuit elements 71 to 76 may form one transmission line by connecting a plurality of transmission lines. Since the one transmission line thus formed includes transmission lines of different widths, a transmission line having an uneven width may be used as the transmission line. One transmission line formed by connecting a plurality of distributed constant circuit elements may be formed by using a copper plate.

Figure 7:
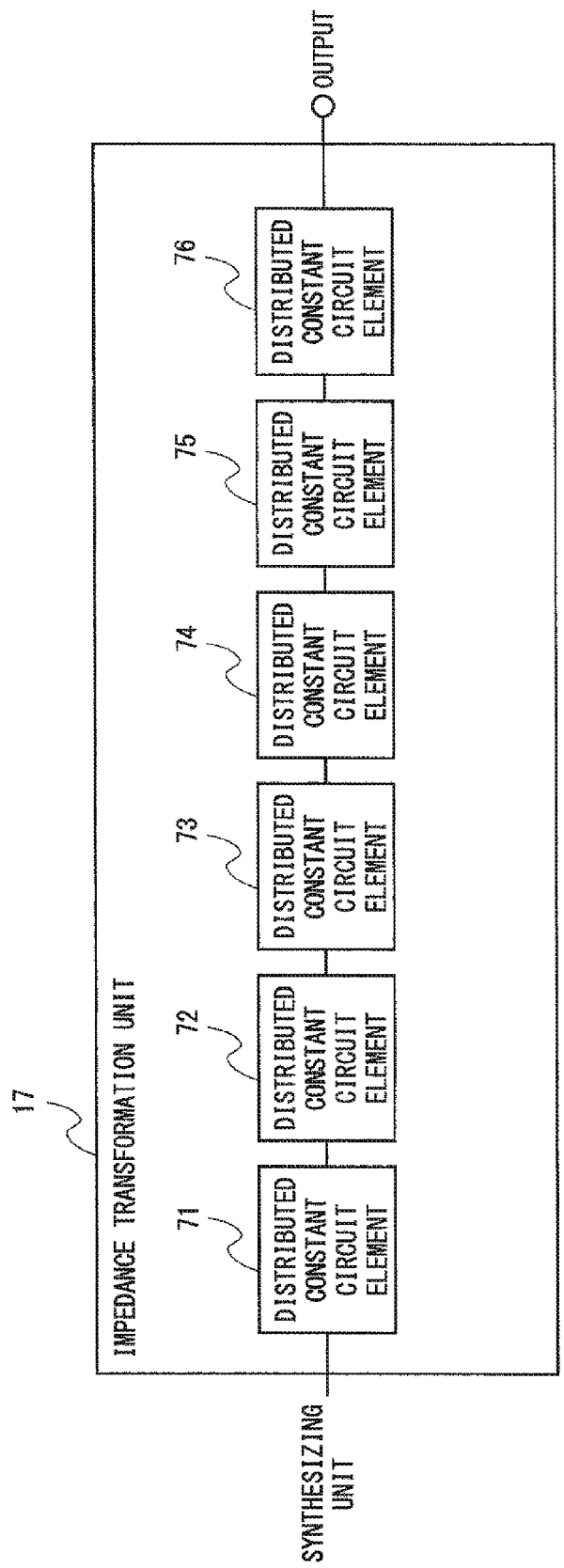
FIG. 7 is a block diagram showing an impedance transformation unit according to a third exemplary embodiment.
Figure 8:
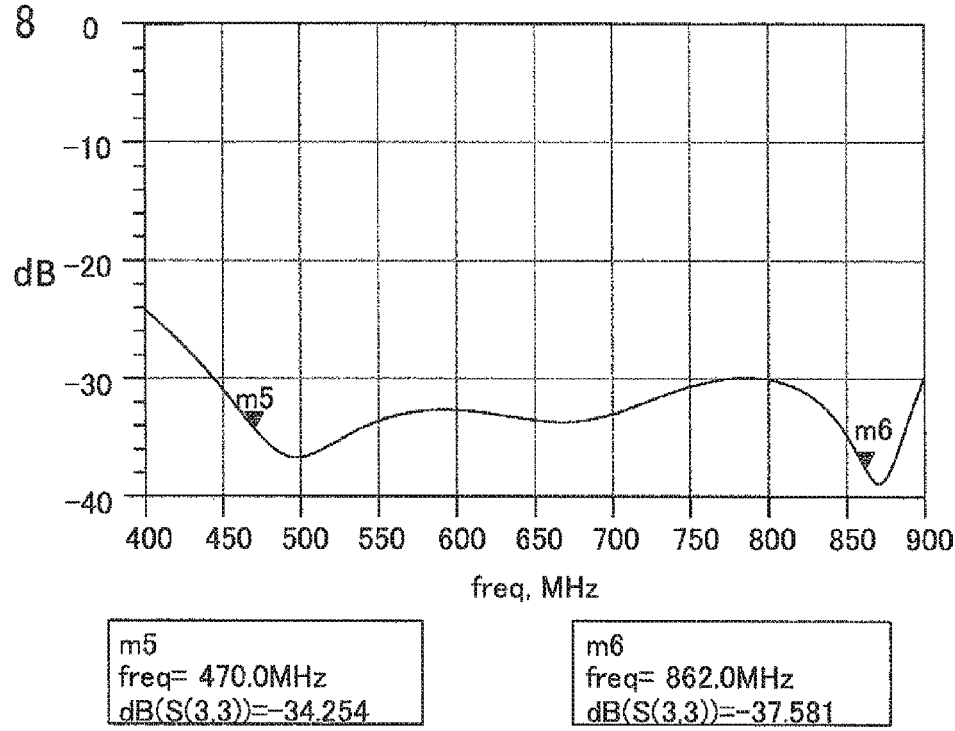
FIG. 8 is a graph for explaining a usable frequency band when the impedance transformation unit according to the third exemplary embodiment is used.

Referring now to FIG. 8, a change in the usable frequency band when the impedance transformation unit 17 shown in FIG. 7 is used will be described. The characteristic impedances of the impedance transformers 61 to 63, for example, when the characteristic impedance at the output terminal of the Doherty amplifier 10 is 50Ω and the impedance of the synthesizing unit 16 is 25Ω, will be described.

For example, the length and width of the distributed constant circuit element 71 are set in such a manner that the distributed constant circuit element 71 has an electrical length of eight degrees at 666 MHz and a characteristic impedance of 100Ω. Similarly, the length and width of each of the distributed constant circuit elements 72 to 76 are set as follows. That is, the distributed constant circuit element 72 has an electrical length of 43 degrees at 666 MHz and a characteristic impedance of 20Ω; the distributed constant circuit element 73 has an electrical length of 19 degrees at 666 MHz and a characteristic impedance of 100Ω; the distributed constant circuit element 74 has an electrical length of 33 degrees at 666 MHz and a characteristic impedance of 20Ω; the distributed constant circuit element 75 has an electrical length of 23 degrees at 666 MHz and a characteristic impedance of 100Ω; and the distributed constant circuit element 76 has an electrical length of 13 degrees at 666 MHz and a characteristic impedance of 20Ω. By connecting these distributed constant circuit elements, one transmission line having an uneven width is formed.

FIG. 8 shows a relationship between a return loss characteristic and a frequency when the electrical length and the transmission line width are set as described above. FIG. 8 shows a case where, assuming that a region of −30 dB or less is an effective band, the effective band is about 450 MHz to 900 MHz. Accordingly, as shown in FIG. 7, the frequency band of the impedance transformation unit 17 can be broadened also when the impedance transformation unit 17 is configured using a distributed constant circuit. Further, when the electrical length is set as described above, the impedance transformation unit 17 shown in FIG. 7 has an electrical length of 139 degrees at a frequency of 666 MHz. Thus, the electrical length of the impedance transformation unit 17 shown FIG. 7 can be reduced in comparison with the impedance transformation unit 17 shown in FIG. 4 which has an electrical length of 270 degrees at 666 MHz. This contributes to the miniaturization of the Doherty amplifier 10.

Figure 9:
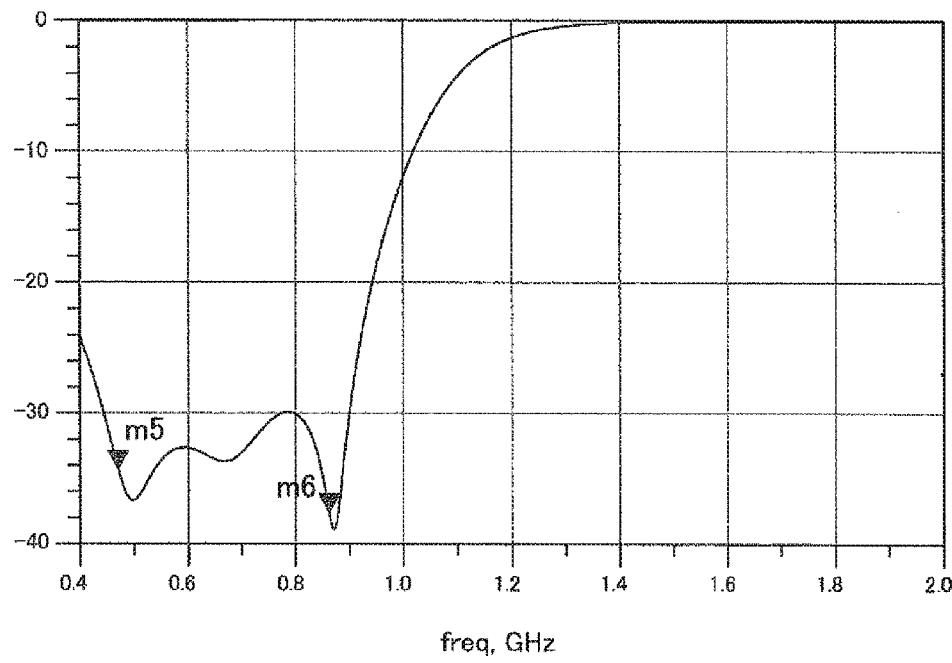
FIG. 9 is a graph for explaining a usable frequency band when the impedance transformation unit according to the third exemplary embodiment is used.

FIG. 9 shows a relationship between a return loss characteristic and an insertion loss characteristic when the frequency band is broadened to the level of GHz. As shown in FIG. 9, the impedance transformation unit 17, which is configured using a distributed constant circuit, also operates as a LPF (Low Pass Filter) having a pass band of about 500 MHz to 900 MHz. In other words, even when the impedance transformation unit 17 is used as the LPF, the frequency band can be broadened so as to allow signals in a predetermined frequency band to pass.

This figure illustrates the configuration of the LPF using the distributed constant circuit as a configuration example of the impedance transformation unit 17. However, the LPF having another circuit configuration may also be used. Moreover, harmonic components generated in the main amplifier 12 and the peak amplifier 14 can be removed by causing the impedance transformation unit 17 to operate as the LPF.

Note that the present invention is not limited to the above exemplary embodiments, and can be modified as appropriate without departing from the scope of the invention.

REFERENCE SIGNS LIST

10 DOHERTY AMPLIFIER
11 DISTRIBUTION UNIT
12 MAIN AMPLIFIER
13 TRANSMISSION LINE UNIT
14 PEAK AMPLIFIER
15 TRANSMISSION LINE UNIT
16 SYNTHESIZING UNIT
17 IMPEDANCE TRANSFORMATION UNIT
20 SIGNAL GENERATION UNIT
30 TRANSMISSION UNIT
40 TRANSMISSION APPARATUS
51 ADJUSTMENT LINE
52 ADJUSTMENT LINE
53 ADJUSTMENT LINE
54 ADJUSTMENT LINE

61 IMPEDANCE TRANSFORMER
62 IMPEDANCE TRANSFORMER
63 IMPEDANCE TRANSFORMER
71 DISTRIBUTED CONSTANT CIRCUIT ELEMENT
72 DISTRIBUTED CONSTANT CIRCUIT ELEMENT
73 DISTRIBUTED CONSTANT CIRCUIT ELEMENT
74 DISTRIBUTED CONSTANT CIRCUIT ELEMENT
75 DISTRIBUTED CONSTANT CIRCUIT ELEMENT
76 DISTRIBUTED CONSTANT CIRCUIT ELEMENT
110 MAIN AMPLIFIER
111 ADJUSTMENT LINE
112 PEAK AMPLIFIER
113 ADJUSTMENT LINE
114 ADJUSTMENT LINE
115 ADJUSTMENT LINE
116 ADJUSTMENT LINE

What is claimed is:

1. A Doherty amplifier comprising:
a distribution unit that distributes input signals;
a main amplifier that amplifies a first distributed signal output from the distribution unit;
a first transmission line unit that transmits the first distributed signal amplified by the main amplifier;
a peak amplifier that amplifies a second distributed signal output from the distribution unit;
a second transmission line unit that transmits the second distributed signal amplified by the peak amplifier;
a synthesizing unit that synthesizes the first distributed signal output from the first transmission line unit and the second distributed signal output from the second transmission line unit, and outputs a synthesized signal; and
an impedance transformation unit that performs an impedance transformation of the synthesized signal output from the synthesizing unit,
wherein the impedance transformation unit includes a plurality of λ/4 transmission lines connected in series, and
the first and second transmission line units are configured using a copper plate, and a length of the copper plate is adjusted when a frequency of the input signals is changed.

2. The Doherty amplifier according to claim 1, wherein the impedance transformation unit is a low-pass filter circuit.

3. The Doherty amplifier according to claim 2, wherein the low-pass filter circuit is a distributed constant circuit.

4. The Doherty amplifier according to claim 3, wherein the distributed constant circuit includes a plurality of distributed constant circuit elements which are connected in series and have different transmission line lengths and different transmission line widths.

5. A transmission apparatus comprising:
a signal generation unit that generates input signals at any frequency;
a distribution unit that distributes the input signals;
a main amplifier that amplifies a first distributed signal output from the distribution unit;
a first transmission line unit that transmits the first distributed signal amplified by the main amplifier;
a peak amplifier that amplifies a second distributed signal output from the distribution unit;
a second transmission line unit that transmits the second distributed signal amplified by the peak amplifier, the second transmission line unit having substantially the same impedance as that of the first transmission line unit;
a synthesizing unit that synthesizes the first distributed signal output from the first transmission line unit and the second distributed signal output from the second transmission line unit, and outputs a synthesized signal;
an impedance transformation unit that performs an impedance transformation of the synthesized signal output from the synthesizing unit; and
a signal transmission unit that transmits a signal output from the impedance transformation unit to an opposite apparatus,
wherein when an adjustment of a transmission line length of each of the first and second transmission line units is required along with a change in frequency of the input signals, a frequency band of the impedance transformation unit is broadened to such an extent that there is no need for adjustment of a transmission line length and
the first and second transmission line units are configured using a copper plate, and a length of the copper plate is adjusted when a frequency of the input signals is changed.

6. The transmission apparatus according to claim 5, wherein the first and second transmission lines are disposed at positions where the first and second transmission lines can be manipulated from an outside of the transmission apparatus, and the impedance transformation unit is disposed at a position where the impedance transformation unit cannot be substantially manipulated from the outside of the transmission apparatus.

* * * * *